United States Patent
Byun

(10) Patent No.: US 7,390,711 B2
(45) Date of Patent: Jun. 24, 2008

(54) MOS TRANSISTOR AND MANUFACTURING METHOD THEREOF

(75) Inventor: Dong-Il Byun, Bucheon (KR)

(73) Assignee: Dongbu Electronics Co., Ltd., Seoul (KR)

(*) Notice: Subject to any disclaimer, the term of this patent is extended or adjusted under 35 U.S.C. 154(b) by 161 days.

(21) Appl. No.: 11/300,292

(22) Filed: Dec. 15, 2005

(65) Prior Publication Data

US 2006/0124969 A1    Jun. 15, 2006

(30) Foreign Application Priority Data

Dec. 15, 2004    (KR) ............... 10-2004-0106129

(51) Int. Cl.
*H01L 21/8238* (2006.01)

(52) U.S. Cl. ............... 438/231; 438/301; 438/303; 438/519; 438/527; 257/E21.334; 257/E21.473; 257/E21.619; 257/E21.634

(58) Field of Classification Search ............... 438/519, 438/529, 551; 257/E21.4, E21.473, E21.474
See application file for complete search history.

(56) References Cited

U.S. PATENT DOCUMENTS

2002/0009857 A1*    1/2002    Fukada et al. ............... 438/303

* cited by examiner

*Primary Examiner*—Michael S. Lebentritt
*Assistant Examiner*—Cheung Lee
(74) *Attorney, Agent, or Firm*—Lowe Hauptman Ham & Berner LLP

(57) ABSTRACT

A MOS transistor including a gate insulation layer and a gate electrode layer on a channel region of a semiconductor substrate. A gate spacer layer is formed on a sidewall of the electrode layer and the insulation layer. The transistor includes a deep extended source/drain region, a first source/drain region that is deeper than the extended source/drain region, and a second source/drain region that is shallower than the extended source/drain region.

5 Claims, 2 Drawing Sheets

MOS TRANSISTOR AND MANUFACTURING METHOD THEREOF

CROSS-REFERENCE TO RELATED APPLICATION

This application claims priority to and the benefit of Korean Patent Application No. 10-2004-0106129 filed in the Korean Intellectual Property Office on Dec. 15, 2004, the entire contents of which are incorporated herein by reference.

BACKGROUND OF THE INVENTION (a) Field of the Invention

The present invention relates to a metal-oxide-silicon (MOS) transistor and a manufacturing method thereof. More particularly, the present invention relates to a MOS transistor and a manufacturing method thereof for suppressing channel hot carrier (CHC) degradation.

(b) Description of the Related Art

FIG. 1 is a cross-sectional view showing a typical MOS transistor.

Referring to FIG. 1, a gate insulation layer 110 and a gate electrode layer 120 are sequentially accumulated on a channel region 102 in a semiconductor substrate 100 such as a silicon substrate. An oxide layer 130 is formed on sidewalls of the gate electrode layer 120, and a capping oxide layer 140 and a gate spacer layer 150 are formed thereon. The capping oxide layer 140 is also formed on a part of the surface of the semiconductor substrate 100. A deep source/drain region 162 and an extended region 161 thereof for forming a lightly doped drain (LDD) structure are formed on a predetermined region of the semiconductor substrate 100.

In such a typical structure of a MOS transistor, the extended region 161 of the source/drain has a shallow junction depth and is formed in order to suppress channel hot carrier (CHC) degradation. However, an increase of a hot carrier concentration in the channel region 102 according to the shallow junction depth thereof may cause difficulty in suppressing the CHC degradation. The increase of a hot carrier concentration in the channel region causes damage to an interface of metal-oxide-silicon (MOS), and thus a voltage-current characteristic of the MOS transistor may be deteriorated.

The above information described in this Background section is only for enhancement of understanding of the background of the invention and therefore it may contain information that does not constitute prior art.

SUMMARY OF THE INVENTION

The present invention has been made in an effort to provide a MOS transistor and a manufacturing method thereof having advantages of suppressing channel hot carrier degradation.

An exemplary MOS transistor according to an embodiment of the present invention includes a gate insulation layer and a gate electrode layer sequentially formed on a channel region in a semiconductor substrate; a gate spacer layer formed on the sidewall of the gate electrode layer and the gate insulation layer; an extended source/drain region having a predetermined depth, defined by the sidewall of the gate electrode layer, and formed on the semiconductor substrate; a first source/drain region that is deeper than the extended source/drain region, that is defined by the gate spacer layer, and that is formed on the semiconductor substrate contacting the extended source/drain region; and a second source/drain region that is shallower than the extended source/drain region, that is defined by the gate spacer layer, and that is formed in the first source/drain region contacting the extended source/drain region.

The exemplary MOS transistor according to an embodiment of the present invention can further include an oxide layer formed on the sidewall of the gate electrode layer.

In addition, the exemplary MOS transistor can further include a capping oxide layer formed between the oxide layer and the gate spacer layer. The capping oxide layer can be formed at a temperature of 700-780° C.

In addition, the impurity concentration in the extended source/drain region and in the first source/drain region can be lower than that in the second source/drain region.

The predetermined depth of the extended source/drain region can be 0.12-0.40 μm.

In addition, the depth of the first source/drain region can be 0.20-0.50 μm, and the depth of the second source/drain region is 0.10-0.35 μm.

An exemplary manufacturing method of a MOS transistor according to another embodiment of the present invention includes forming a gate stack with a gate insulation layer and a gate electrode layer on a semiconductor substrate; forming an extended source/drain region having a predetermined depth by a first ion implantation process using the gate stack as an ion implantation mask; forming a gate spacer layer on the sidewall of the gate stack; forming a first source/drain region that is deeper than the extended source/drain region by a second ion implantation process using the gate spacer layer as an ion implantation mask; and forming a second source/drain region that is shallower than the extended source/drain region by a third ion implantation process using the gate spacer layer as an ion implantation mask.

The exemplary manufacturing method of the MOS transistor according to another embodiment of the present invention can further include forming an oxide layer on a sidewall of the gate electrode layer after forming the gate stack. In addition, the exemplary manufacturing method of the MOS transistor can further include forming a capping oxide layer on the oxide layer. The capping oxide layer can be formed at a temperature of 700-780° C.

The impurity concentration of the third ion implantation process can be higher than that of the first and second ion implantation process.

The predetermined depth of the extended source/drain region can be 0.12-0.40 μm.

In addition, the depth of the first source/drain region can be 0.20-0.50 μm, and the depth of the second source/drain region can be 0.10-0.35 μm.

DETAILED DESCRIPTION OF THE EMBODIMENTS

An exemplary embodiment of the present invention will hereinafter be described in detail with reference to the accompanying drawings. However, exemplary embodiments of the present invention can be variously modified, and it should not be understood that the scope of the present invention is limited to the exemplary embodiments.

FIG. 2 is a cross-sectional view showing an exemplary MOS transistor according to an embodiment of the present invention.

Figure 2:
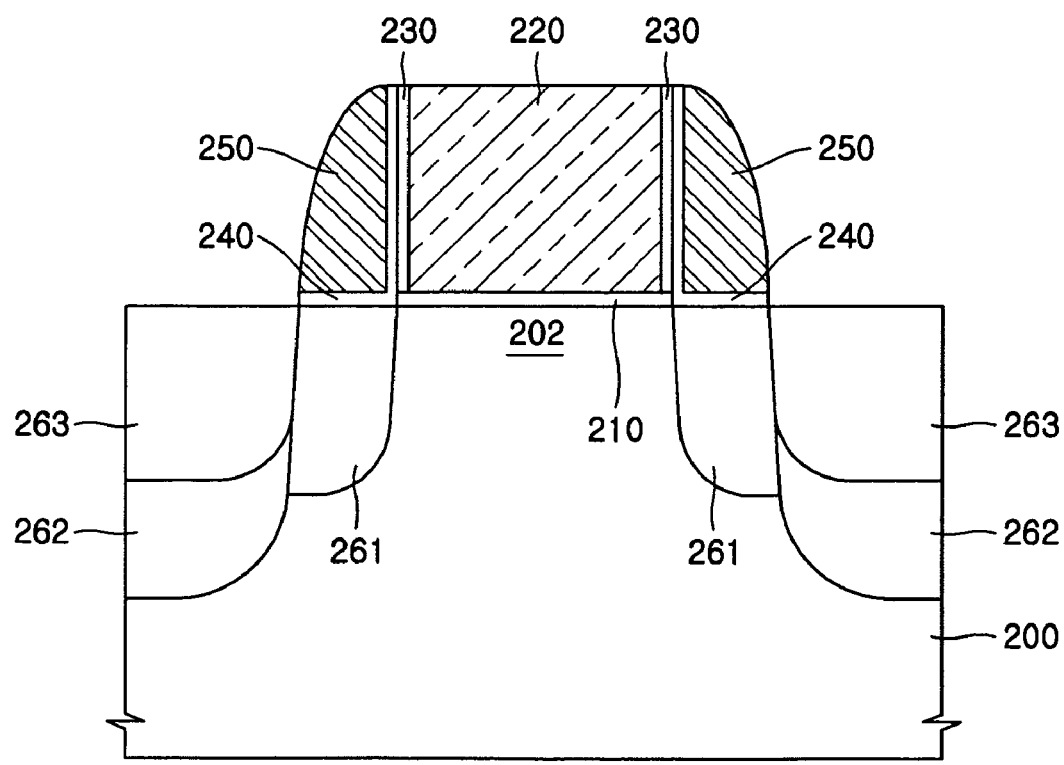
FIG. 2 is a cross-sectional view showing an exemplary MOS transistor according to an embodiment of the present invention.

Referring to FIG. 2, a gate insulation layer 210 and a gate electrode layer 220 are sequentially accumulated so as to form a gate stack on a channel region 202 in a semiconductor substrate 200 (i.e., a silicon substrate). The gate insulation layer 210 can be formed as an oxide layer, and the gate electrode layer 220 can be formed as a polysilicon layer. An oxide layer 230 is formed at the sidewalls of the gate electrode layer 220. In addition, a capping oxide layer 240 and a gate spacer layer 250 are sequentially formed on the sidewalls of the gate stack. The capping oxide layer 240 can be formed as a middle temperature oxide (MTO) that is formed at a temperature of 700-780° C. The gate spacer layer 250 can be formed as a nitride layer. If the capping oxide layer 240 is formed as a middle temperature oxide, boron penetration and diffusion during a high temperature annealing process for diffusing impurity ions can be effectively suppressed.

Figure 1:
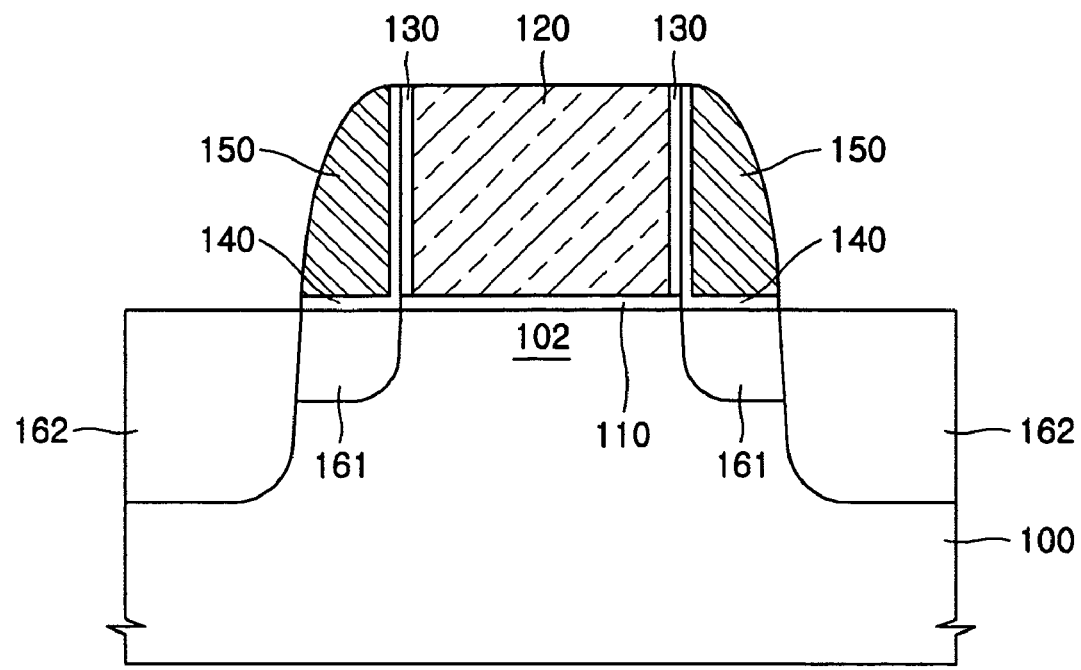
FIG. 1 is a cross-sectional view showing a typical MOS transistor.

A source/drain region having a lightly doped drain (LDD) structure is formed on a predetermined region of the semiconductor substrate 200. First, an extended source/drain region 261 is formed at both lateral sides of the gate stack. The extended source/drain region 261 has a predetermined depth that is similar to a junction depth of a typical source/drain. That is, the predetermined depth of the extended source/drain region 261 is deeper than a junction depth of an extended source/drain region 161 of FIG. 1 of a typical LDD structure, and it is similar to a junction depth of a typical deep source/drain region 162 of FIG. 1. The first source/drain region 262 is then formed at both lateral sides of the gate spacer layer 250 such that it has a predetermined depth that is deeper than that of the extended source/drain region 261. In addition, the second source/drain region 263 is also formed at both lateral sides of the gate spacer layer 250 in the first source/drain region 262 and has a predetermined depth that is shallower than that of the extended source/drain region 261.

The predetermined depth of the extended source/drain region 261 can be 0.12-0.40 μm. In addition, the depth of the first source/drain region 262 may be 0.20-0.50 μm, and the depth of the second source/drain region 263 can be 0.10-0.35 μm.

As described above, the extended source/drain region having a depth that is similar to a junction depth of a typical source/drain can disperse an electric field parallel to a channel region into the whole source/drain junction, and therefore channel hot carrier degradation can be suppressed.

Figure 3:
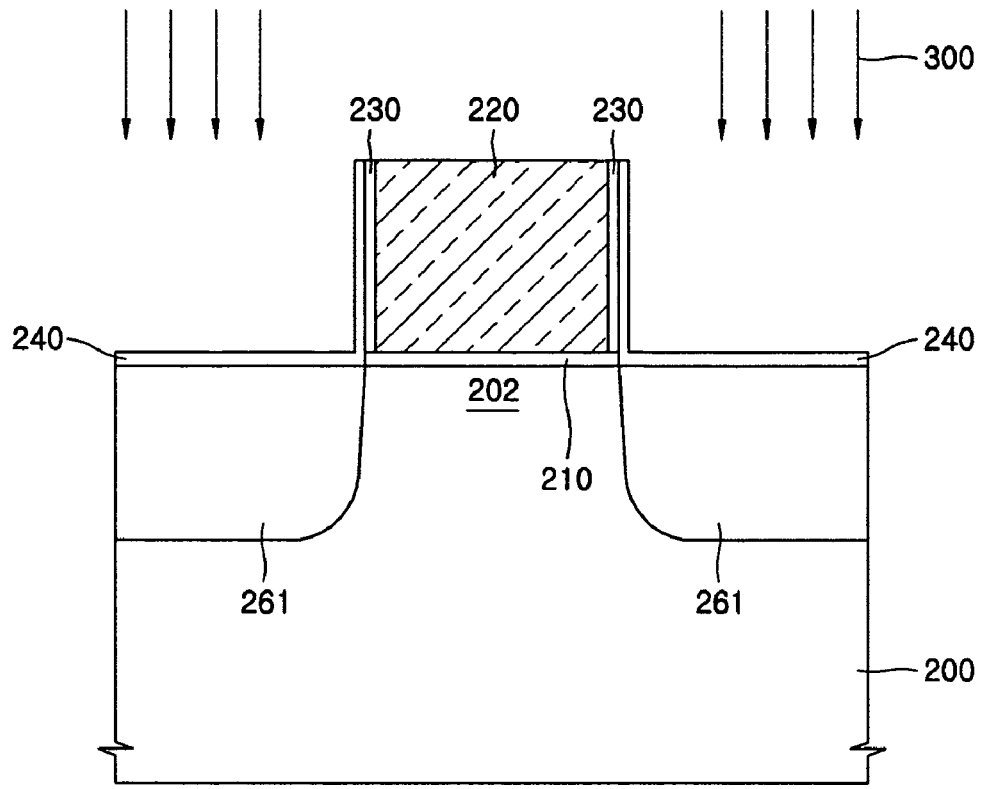
FIG. 3 and FIG. 4 are cross-sectional views showing principal stages of a MOS transistor according to an exemplary embodiment of the present invention.
Figure 4:
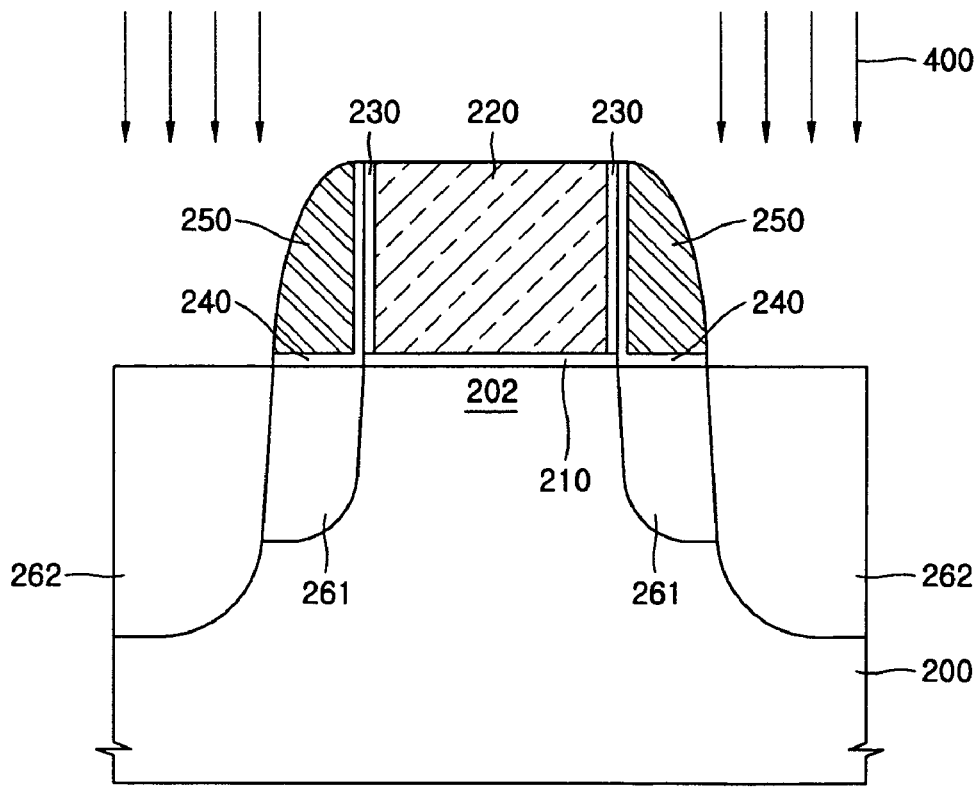

FIG. 3 and FIG. 4 are cross-sectional views showing principal stages of a MOS transistor according to an exemplary embodiment of the present invention.

Referring to FIG. 3, a gate insulation layer 210 and a gate electrode layer 220 are sequentially accumulated on a semiconductor substrate 200 so as to form a gate stack. At this time, an insulation layer such as an oxide layer is formed on the semiconductor substrate 200, and then a conductive layer as a gate electrode layer, for example a polysilicon layer, is formed on the insulation layer. Subsequently, a mask layer pattern having a predetermined opening is formed on the conductive layer. The exposed layers of the conductive layer and the insulation layer are sequentially removed by an etching process using the mask layer pattern as an etching mask. A gate stack as shown in the drawing is thereby formed. After forming the gate stack, the mask layer pattern is removed. In addition, an oxide layer 230 is formed at the sidewalls of the gate electrode layer, and a capping oxide layer 240 is formed thereon. The capping oxide layer 240 is formed as a middle temperature oxide (MTO) layer at a temperature of 700-780° C.

Subsequently, as shown by arrows 300 in the drawing, a first ion implantation process using the gate stack as an implantation mask is performed so as to form an extended source/drain region 261 having a predetermined depth. The extended source/drain region 261 is more deeply formed than a typical source/drain junction. For this purpose, the ion energy of the first ion implantation process can be higher than that of an ion implantation process for forming a typical extended source/drain region.

Referring to FIG. 4, a gate spacer layer 250 is formed on the sidewalls of the capping oxide layer 240. The gate spacer layer 250 can be formed as a nitride layer. In forming the gate spacer layer 250, a nitride layer is firstly formed on the entire surface over the semiconductor substrate. Subsequently, the nitride layer is anisotropically etched to form a gate spacer layer 250. As shown by arrows 400 in the drawing, a second ion implantation process using the gate spacer layer 250 as an implantation mask is performed so as to form a first source/drain region 262 deeper than the extended source/drain region 261.

Subsequently, a third ion implantation process using the gate spacer layer 250 as an implantation mask is performed so as to form a second source/drain region 263, as shown in FIG. 2, that is shallower than the extended source/drain region 261.

The predetermined depth of the extended source/drain region 261 can be 0.12-0.40 μm. In addition, the depth of the first source/drain region 262 can be 0.20-0.50 μm, and the depth of the second source/drain region 263 can be 0.10-0.35 μm.

In such a source/drain structure, the first source/drain region 262 and the extended source/drain region 261 can act as lightly doped drain regions of a typical LDD structure. The second source/drain region 263 can act as a typical source/drain region. Therefore, the impurity concentration of the extended source/drain region 261 and the first source/drain region 262 can be lower than that of the second source/drain region 263.

In particular, the extended source/drain region 261 and the first source/drain region 262 surround the second source/drain region 263 that is highly doped, so the generation of the hot carriers at the interface of the highly doped region can be suppressed.

As described above, an exemplary MOS transistor and a manufacturing method thereof according to an embodiment of the present invention has a deep extended source/drain region, a first source/drain region that is deeper than the extended source/drain region, and a second source/drain region that is shallower than the extended source/drain region. Consequently, it can suppress channel hot carrier degradation by dispersing an electric field parallel to a channel region into the whole source/drain junction. In addition, a medium temperature oxide layer is used as a capping oxide layer, and therefore boron penetration and diffusion during a high temperature annealing process can be effectively suppressed.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method of a MOS transistor, comprising:

forming a gate stack with a gate insulation layer and a gate electrode layer on a semiconductor substrate;

forming an oxide layer at the sidewall of the gate electrode layer;

forming a capping oxide layer on the oxide layer, wherein the capping oxide layer is formed as a middle temperature oxide (MTO) that is formed at a temperature of 700-780° C.;

forming an extended source/drain region having a predetermined depth by a first ion implantation process using the gate stack as an ion implantation mask;

forming a gate spacer layer on a sidewall of the gate stack;

forming a first source/drain region that is deeper than the extended source/drain region by a second ion implantation process using the gate spacer layer as an ion implantation mask; and forming a second source/drain region that is shallower than the extended source/drain region by a third ion implantation process using the gate spacer layer as an ion implantation mask.

2. The manufacturing method of claim 1, wherein an impurity concentration of the third ion implantation process is higher than an impurity concentration of the first ion implantation process.

3. The manufacturing method of claim 2, wherein the impurity concentration of the third ion implantation process is higher than an impurity concentration of the second ion implantation process.

4. The manufacturing method of claim 1, wherein the predetermined depth of the extended source/drain region is 0.12-0.40 μm.

5. The manufacturing method of claim 4, wherein the depth of the first source/drain region is 0.20-0.50 μm, and the depth of the second source/drain region is 0.10-0.35 μm.

* * * * *